(12) United States Patent
Sun

(10) Patent No.: US 10,530,180 B2
(45) Date of Patent: Jan. 7, 2020

(54) BATTERY OUTPUT MONITORING DEVICE AND BATTERY OUTPUT MONITORING METHOD

(71) Applicant: TOYOTA JIDOSHA KABUSHIKI KAISHA, Toyota-shi, Aichi-ken (JP)

(72) Inventor: Linyu Sun, Anjo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/050,534

(22) Filed: Jul. 31, 2018

(65) Prior Publication Data
US 2019/0081501 A1 Mar. 14, 2019

(30) Foreign Application Priority Data

Sep. 11, 2017 (JP) ................................. 2017-174122

(51) Int. Cl.
| | |
|---|---|
| *H02J 7/00* | (2006.01) |
| *H02J 7/04* | (2006.01) |
| *G01R 31/389* | (2019.01) |
| *G01R 31/3842* | (2019.01) |

(52) U.S. Cl.
CPC ............ *H02J 7/045* (2013.01); *G01R 31/389* (2019.01); *G01R 31/3842* (2019.01); *H02J 7/0047* (2013.01)

(58) Field of Classification Search
CPC ...................................................... H02J 7/045
USPC ......................................................... 320/134
See application file for complete search history.

(56) References Cited

U.S. PATENT DOCUMENTS

| | | | | |
|---|---|---|---|---|
| 6,211,681 B1* | 4/2001 | Kagawa | ................... | B60K 6/46 |
| | | | | 324/426 |
| 9,869,724 B2* | 1/2018 | Kimura | .............. | G01R 31/3835 |
| 10,371,753 B1* | 8/2019 | Wang | .................... | G01R 31/382 |
| 2007/0120530 A1* | 5/2007 | Nozaki | ................. | B60L 3/0046 |
| | | | | 320/130 |
| 2014/0277879 A1* | 9/2014 | Sheidler | ................. | A01D 41/12 |
| | | | | 701/22 |
| 2016/0018468 A1* | 1/2016 | Ho | ...................... | G01R 31/3835 |
| | | | | 324/426 |

(Continued)

FOREIGN PATENT DOCUMENTS

| | | |
|---|---|---|
| EP | 2 933 649 A2 | 10/2015 |
| GB | 2 278 452 A | 11/1994 |

(Continued)

*Primary Examiner* — Yalkew Fantu
(74) *Attorney, Agent, or Firm* — Oliff PLC

(57) ABSTRACT

A battery output monitoring device includes: a battery characteristics estimating unit which estimates an internal resistance value and a current-less voltage of the battery; a guard power calculating unit which calculates, based on at least the internal resistance value, a guard power to be greater than a required power to correspond to at least a decrease in a state of charge and progress of polarization of the battery during a predetermined period, the guard power being a power required to be a currently available output power of the battery so as to output the required power at a predetermined minimum voltage during the predetermined period; and a determination unit which instructs an external alarm device to perform an alarm operation when a difference between the current power and the guard power is less than a predetermined value.

7 Claims, 3 Drawing Sheets

(56) References Cited

U.S. PATENT DOCUMENTS

2016/0372954 A1* 12/2016 Kageyama ............ H02J 7/0029

FOREIGN PATENT DOCUMENTS

| JP | 2010-220391 A | 9/2010 |
| JP | 2015-073427 A | 4/2015 |
| WO | 2015 033210 A1 | 3/2015 |

\* cited by examiner

BATTERY OUTPUT MONITORING DEVICE AND BATTERY OUTPUT MONITORING METHOD

CROSS-REFERENCE TO RELATED APPLICATIONS

The disclosure of Japanese Patent Application No. 2017-174122 filed on Sep. 11, 2017 including the specification, drawings and abstract is incorporated herein by reference in its entirety.

BACKGROUND

1. Technical Field

The disclosure relates to a device and a method for monitoring an output of a battery which is mounted in a vehicle or the like.

2. Description of Related Art

Various techniques for efficient use or appropriate management of a battery which is mounted in a vehicle have been proposed. Japanese Unexamined Patent Application Publication No. 2010-220391 (JP 2010-220391 A) discloses a technique for satisfying a required output power and reducing a frequency of charging to curb deterioration of a battery by calculating a current maximum output power of a battery and changing a lower limit value of a SOC at the time of actual use based on a result of comparison with a predetermined required output power. Japanese Unexamined Patent Application Publication No. 2015-73427 (JP 2015-73427 A) discloses a technique of determining whether to perform maintenance based on deviations in capacity or internal resistance between battery blocks which are included in a battery pack and notifying that maintenance is necessary if necessary.

SUMMARY

Preserving a constant state of charge and maintaining a predetermined power during a predetermined period may be required for a battery which is mounted in a vehicle depending on specifications of the vehicle. For example, in a case of a vehicle including a mechanism that maintains a posture by controlling heights of vehicle wheels with electric power supplied from a battery, when an abnormality occurs in the vehicle, maintaining a power for operating the mechanism is required for the battery during a period which is necessary for stopping the vehicle. When it may be difficult to maintain such a power, by rapidly notifying the user, it is possible to prompt a user to stop the vehicle during a period in which such a power is maintained. However, in the above-mentioned techniques, it is not possible to actually determine whether the battery will be able to maintain a predetermined power in a predetermined period from a current time or to notify the user of a result of determination thereof.

The disclosure is made in consideration of the above-mentioned problem and provides a battery output monitoring device and a battery output monitoring method for determining whether a battery can maintain a predetermined power during a predetermined period.

According to an aspect of the disclosure, there is provided a battery output monitoring device including a battery characteristics estimating unit, a current power calculating unit, a guard power calculating unit, and a determination unit. The battery characteristics estimating unit is configured to acquire a plurality of sets of measured values of a current and a voltage of a battery and to estimate an internal resistance value and a current-less voltage of the battery based on the sets of measured values. The current power calculating unit is configured to calculate a current power, which is a currently available output power of the battery at a predetermined minimum voltage based on the internal resistance value and the current-less voltage. The guard power calculating unit is configured to calculate, based on at least the internal resistance value, a guard power to be greater than a required power to correspond to at least a decrease in a state of charge and progress of polarization of the battery during a predetermined period. The required power is a power required for the battery to output, and the guard power is a power required to be a currently available output power of the battery so as to output the required power at the predetermined minimum voltage during the predetermined period. The determination unit is configured to instruct an external alarm device to perform an alarm operation when a difference between the current power and the guard power is less than a predetermined value.

According to this configuration of the battery output monitoring device, it is possible to determine whether the battery can maintain a predetermined power during a predetermined period and to notify a user of such information before the battery becomes unable to maintain the power.

In the battery output monitoring device, the plurality of sets of measured values may include a set of measured values during charging of the battery and a set of measured values during discharging of the battery.

With this battery output monitoring device, it is possible to obtain a set of measured values in which characteristics of the battery are more accurately reflected.

In the battery output monitoring device, the battery characteristics estimating unit may be configured to estimate the internal resistance value by multiplying a magnitude of a rate of change of the voltage with respect to the current calculated by linear regression by a coefficient greater than 1.

With this battery output monitoring device, it is possible to reduce concern that change of the internal resistance value during a calculation period or the internal resistance value due to a sensor error will be underestimated.

In the battery output monitoring device, the battery characteristics estimating unit may be configured: to acquire the sets of measured values from time to time; and to update the estimated values of the internal resistance value and the current-less voltage by smoothing the internal resistance value and the current-less voltage which are estimated based on the newly acquired measured values and the internal resistance values and the current-less voltages which were previously estimated.

With this battery output monitoring device, it is possible to perform more accurate estimation while curbing rapid change of the estimated value.

In the battery output monitoring device, the guard power calculating unit may be configured: to calculate a first open-circuit voltage which is an open-circuit voltage when the required power is able to be output at the predetermined minimum voltage based on the internal resistance value; to calculate a state of charge corresponding to the first open-circuit voltage based on a previously prepared first map, calculate an energy which the battery is to output during the predetermined period based on the required power, calculate a product of a full charging capacity and a nominal voltage of the battery as total energy which is able to be maintained by the battery, add a ratio of energy which is to be output during the predetermined period to the total energy to the state of charge, and calculate a second open-circuit voltage which is an open-circuit voltage corresponding to the sum state of charge to which the ratio of energy has been added based on the previously prepared first map; to calculate a third open-circuit voltage by adding a polarization value calculated using a predetermined method to the second open-circuit voltage; and to calculate the power of the battery at the predetermined minimum voltage as the guard power based on the third open-circuit voltage and the internal resistance value.

In the battery output monitoring device, the guard power calculating unit may be configured to calculate the polarization value using a previously prepared second map in which a correlation between a temperature of the battery and the polarization value corresponding to the energy which is output during the predetermined period is determined in advance using the predetermined method.

With this battery output monitoring device, it is possible to accurately determine whether the battery can maintain the predetermined power during the predetermined period in consideration of a decrease in a state of charge or progress of polarization of the battery.

According to another aspect of the disclosure, there is provided a battery output monitoring method of a battery output monitoring device. That is, the battery output monitoring method includes: acquiring a plurality of sets of measured values of a current and a voltage of a battery and estimating an internal resistance value and a current-less voltage of the battery based on the sets of measured values; calculating a current power which is a currently available output power of the battery at a predetermined minimum voltage based on the internal resistance value and the current-less voltage; calculating, based on at least the internal resistance value, a guard power to be greater than a required power to correspond to at least a decrease in a state of charge and progress of polarization of the battery during a predetermined period, the required power being a power required for the battery to output, and the guard power being a power required to be a currently available output power of the battery so as to output the required power at the predetermined minimum voltage during the predetermined period; and instructing an external alarm device to perform an alarm operation when a difference between the current power and the guard power is less than a predetermined value.

According to this configuration of the battery output monitoring method, it is possible to determine whether the battery can maintain a predetermined power during a predetermined period and to notify a user of such information before the battery becomes unable to maintain the power.

As described above, according to the disclosure, it is possible to provide a battery output monitoring device and a battery output monitoring method for determining whether a battery can maintain a predetermined power during a predetermined period.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

In a battery output monitoring process according to the disclosure, a required power which currently has to be output by a battery for the purpose of outputting a predetermined power during a predetermined period is calculated and the calculated required power is compared with a power which can be currently actually output from the battery. Particularly, a decrease in a state of charge or progress of polarization of a battery is considered in calculating such a power. Accordingly, it is possible to notify a user that a predetermined power cannot be maintained during a predetermined period from a current time and to prompt the user to stop the vehicle before the predetermined power is not able to be maintained.

Hereinafter, an embodiment of the disclosure will be described in detail with reference to the accompanying drawings.

Figure 1:
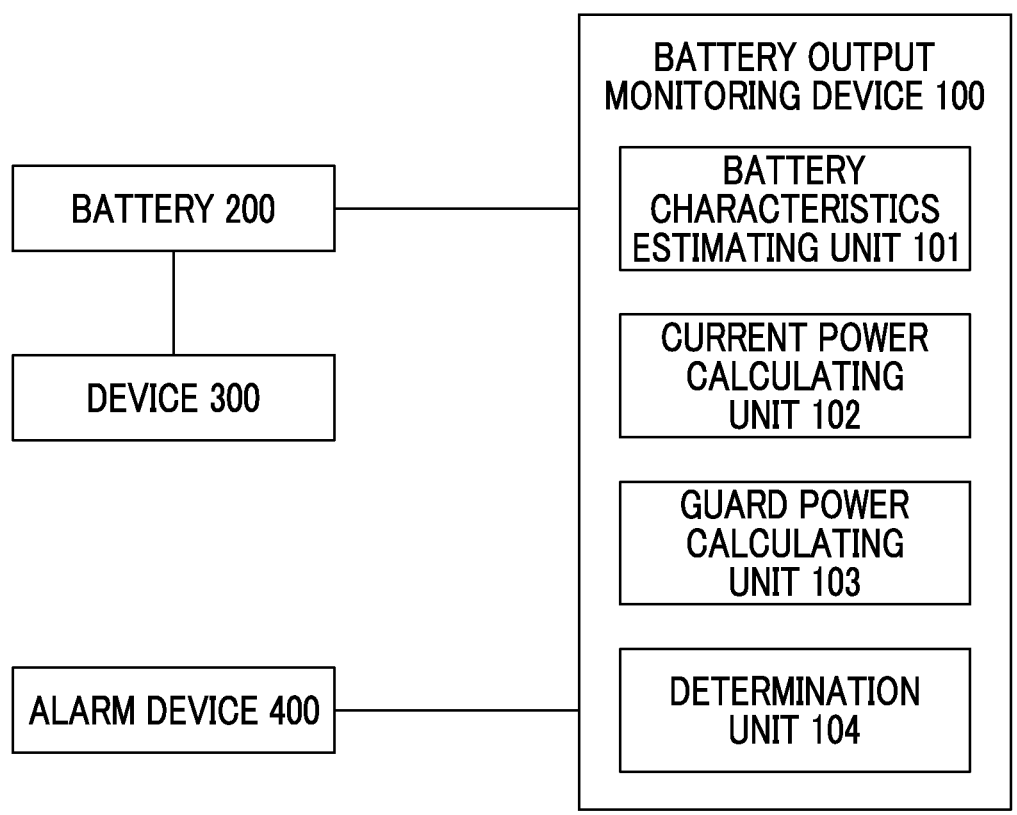
FIG. 1 is a block diagram illustrating a device that is mounted in a vehicle according to an embodiment of the disclosure.

First, a block diagram illustrating various devices which are mounted in a vehicle according to this embodiment is illustrated in FIG. 1. A battery 200, a device 300, a battery output monitoring device 100, and an alarm device 400 are mounted in the vehicle. The battery 200 supplies electric power to the device 300. When an abnormality occurs, it is necessary to supply a predetermined power to the device 300 during a predetermined period. The number of devices 300 may be equal to or greater than two. The battery 200 may supply electric power to other devices which are not illustrated before an abnormality occurs. The battery output monitoring device 100 includes a battery characteristics estimating unit 101, a current power calculating unit 102, a guard power calculating unit 103, and a determination unit 104, and monitors the battery 200. The alarm device 400 performs an alarm operation for a user in response to an instruction from the battery output monitoring device 100.

Figure 2:
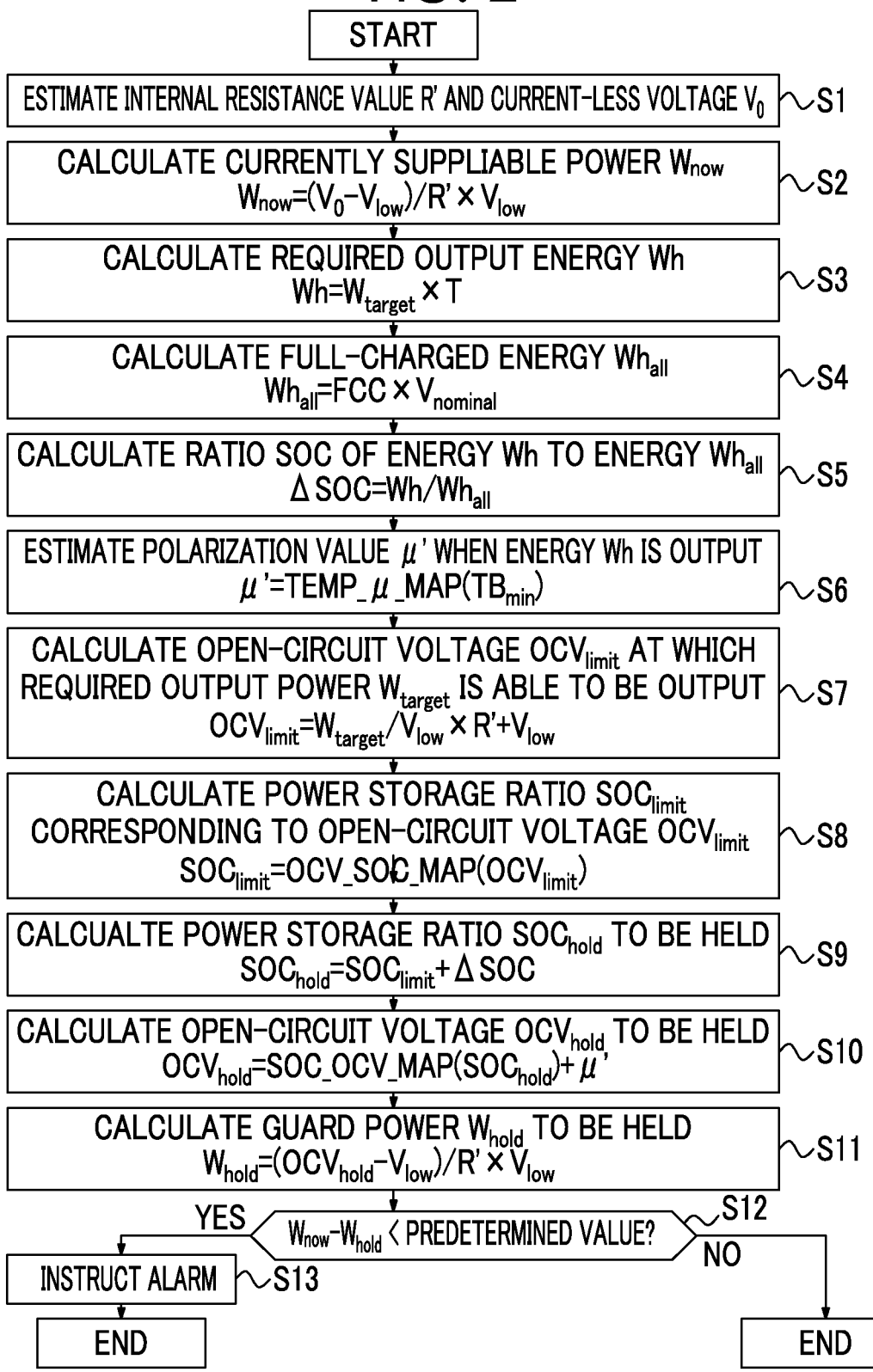
FIG. 2 is a flowchart illustrating a battery output monitoring process according to the embodiment of the disclosure.
Figure 3:
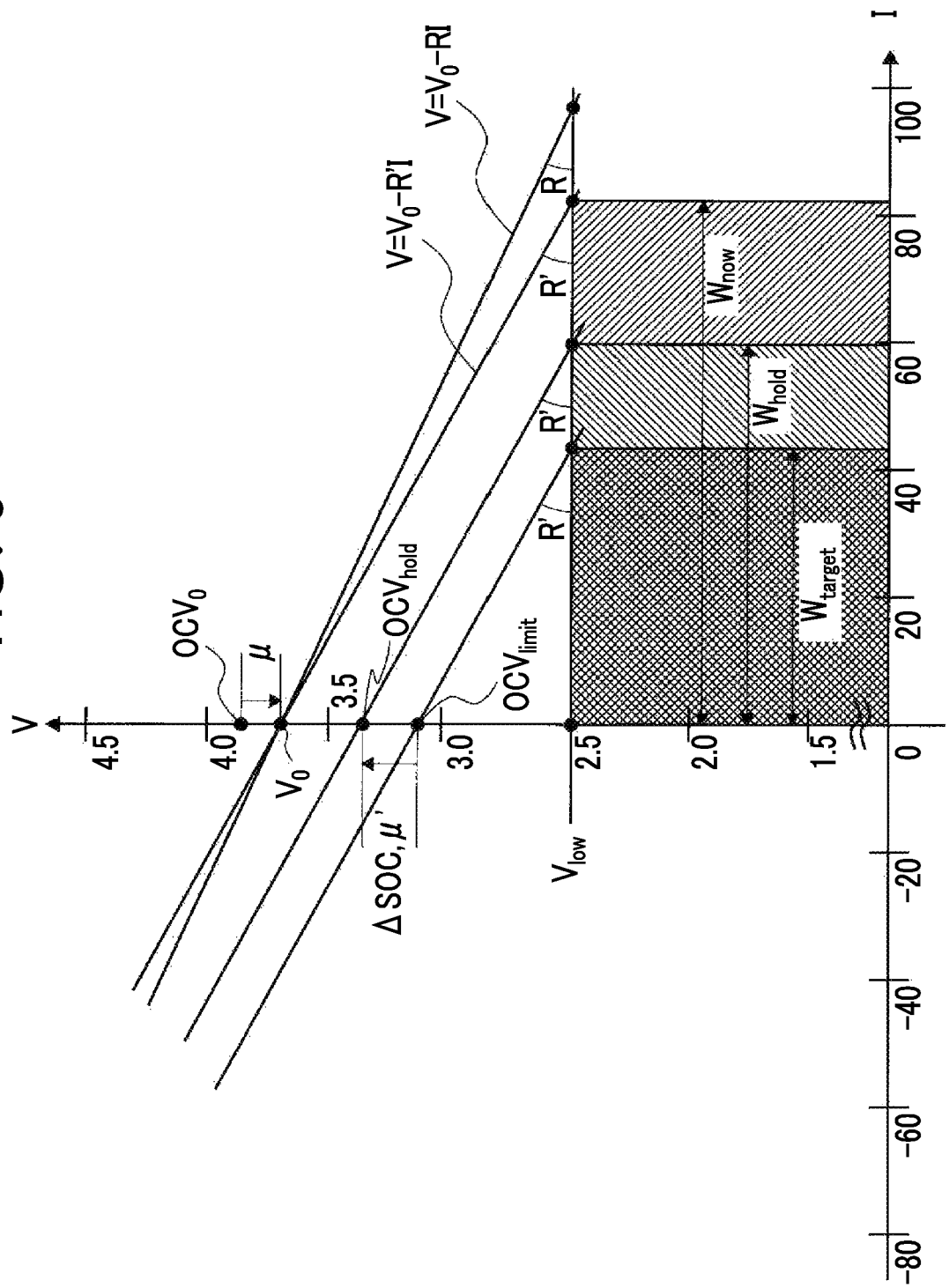
FIG. 3 is a graph illustrating calculated values which are used for the battery output monitoring process according to the embodiment of the disclosure.

An example of a battery output monitoring process according to this embodiment will be described below. FIG. 2 is a flowchart illustrating the battery output monitoring process which is performed by the units of the battery output monitoring device 100. FIG. 3 is a graph in which the horizontal axis represents a current I and the vertical axis represents a voltage V and is a graph illustrating calculated values which are used for the battery output monitoring process. By periodically repeatedly performing the following process flow, it is possible to monitor the electric power of the battery 200 from time to time.

Step S1 illustrated in FIG. 2 will be described. The battery characteristics estimating unit 101 monitors an output power of the battery 200 and acquires a plurality of sets of measured values of a current value and a voltage value. The battery characteristics estimating unit 101 performs linear regression (straight line fitting) using a method such as a least square method, calculates a magnitude of a slope of a straight line (a rate of change of a voltage with respect to a current) as an estimated value of an internal resistance value R of the battery 200, and calculates a Y-intercept (I=0) as an estimated value of a current-less voltage $V_0$. The relationship between the current I and the voltage V satisfies $V=V_0-RI$. A graph of $V=V_0-RI$ is illustrated in FIG. 3. Here, $V_0$ has a value obtained by subtracting a current polarization value μ from a current open-circuit voltage $OCV_0$ of the battery 200, that is, $V_0=OCV_0-\mu$. When the battery 200 includes a plurality of cells, the internal resistance value for each cell is estimated and the sum of the estimated values is set as the internal resistance value R.

When the current values in a set of measured values which are used for calculation have a spread, it is possible to estimate an internal resistance value with higher accuracy. When sets of measured values during charging (in which a current value is negative) as well as during discharging (in which a current value is positive) are acquired, it is possible to acquire a set of measured value in which characteristics of the battery 200 are more accurately reflected. For this reason, in a set of measured values which is used for calculation, it is preferable that a variance of current values be equal to or greater than a predetermined value and an average value thereof be equal to or less than a predetermined value.

A value R' $(=\alpha R$ $(1<\alpha))$ obtained by multiplying an internal resistance value R calculated by linear regression by a coefficient greater than 1 may be used as an estimated value of the internal resistance. Accordingly, since a slightly larger internal resistance value is estimated, it is possible to reduce concern that a reduction in output power will be underestimated due to an error occurring due to change in the internal resistance value of the battery 200 when a voltage of the battery 200 and a current flowing in the battery 200 are measured or when the internal resistance is estimated. A graph of $V=V_0-R'I$ is illustrated in FIG. 3. An example in which R' is used as the estimated internal resistance value will be described below.

It is preferable that the estimated values of the internal resistance value and the current-less voltage value be updated by acquiring the measured values of the current value and the voltage value from time to time and smoothing the internal resistance value and the current-less voltage value which are estimated using the newly acquired measured values and the internal resistance values and the current-less voltage values which were previously estimated. Accordingly, it is possible to obtain more accurate estimated values while curbing rapid change of the internal resistance value and the current-less voltage value and to cause the determination unit 104 to perform accurate determination while stabilizing the calculated values in processes which will be described later.

Step S2 will be described next. The current power calculating unit 102 calculates a power which can be currently supplied by the battery 200. The voltage which is used for calculation is defined as $V_{low}$. $V_{low}$ is a lower-limit voltage with which the device 300 can operate and is a voltage which is actually supplied to the device 300. With this voltage $V_{low}$, the power $W_{now}$ which can be currently output by the battery 200 can be calculated by Equation 1.

$$W_{now}=(V_0-V_{low})/R'\times V_{low} \qquad \text{(Equation 1)}$$

Step S3 will be described next. The guard power calculating unit 103 calculates an energy Wh which the battery 200 is required to output at the time of occurrence of an abnormality. When a predetermined power required for the battery 200 is defined as $W_{target}$ and a length of a predetermined period in which maintaining of the power is required is defined as T, the energy Wh can be calculated by Equation 2.

$$Wh=W_{target}\times T \qquad \text{(Equation 2)}$$

Step S4 will be described next. The guard power calculating unit 103 calculates an amount of energy $Wh_{all}$ which is accumulated in the battery 200 when the battery is fully charged. When a full charging capacity is defined as FCC and a nominal voltage is defined as $V_{nominal}$, the amount of energy can be calculated by Equation 3.

$$Wh_{all}=FCC\times V_{nominal} \qquad \text{(Equation 3)}$$

Step S5 will be described next. The guard power calculating unit 103 calculates a state of charge ΔSOC which is a ratio of the energy Wh to the amount of energy $Wh_{all}$ accumulated in the battery 200 when the battery is fully charged. The state of charge ΔSOC can be calculated by Equation 4.

$$\Delta SOC=Wh/Wh_{all} \qquad \text{(Equation 4)}$$

Step S6 will be described next. The guard power calculating unit 103 calculates an estimated value μ' of a polarization value at a time point at which the battery 200 outputs the energy Wh during the predetermined period T. The polarization value is correlated with the temperature of the battery 200 and the energy Wh which is output during the predetermined period T. Since the energy Wh which is output during the predetermined period T is determined by a system request, the polarization value can be estimated using a second map in which a correlation between the temperature of the battery and the polarization value is determined in advance. When the polarization value at the minimum temperature $TB_{min}$ of the battery which is acquired with reference to the second map is defined as $\mu=TEMP\_\mu\_MAP(TB_{min})$, the estimated polarization value μ' can be expressed by Equation 5.

$$\mu'=TEMP\_\mu\_MAP(TB_{min}) \qquad \text{(Equation 5)}$$

Step S7 will be described next. The guard power calculating unit 103 calculates an open-circuit voltage $OCV_{limit}$ (a first open-circuit voltage) when the battery 200 can output a predetermined power $W_{target}$ at the voltage $V_{low}$. The open-circuit voltage $OCV_{limit}$ can be calculated by Equation 6.

$$OCV_{limit}=W_{target}/V_{low}\times R'+V_{low} \qquad \text{(Equation 6)}$$

Step S8 will be described next. The guard power calculating unit 103 calculates a state of charge $SOC_{limit}$ when the open-circuit voltage of the battery 200 is the voltage $OCV_{limit}$. Since the state of charge is correlated with the open-circuit voltage OCV of the battery 200, the state of charge can be calculated using a first map in which a correlation between the open-circuit voltage OCV and the state of charge SOC is defined in advance. When the state of charge at the open-circuit voltage OCV acquired with reference to the first map is defined as $SOC=OCV\_SOC\_MAP(OCV)$, the state of charge $SOC_{limit}$ can be expressed by Equation 7.

$$SOC_{limit}=OCV\_SOC\_MAP(OCV_{limit}) \qquad \text{(Equation 7)}$$

Step S9 will be described next. The guard power calculating unit 103 calculates a state of charge $SOC_{hold}$ which has to be maintained by the battery 200 in order to output a predetermined power $W_{target}$ at the voltage $V_{low}$ during the predetermined period T in which the battery 200 outputs the energy Wh corresponding to the state of charge ΔSOC. The state of charge $SOC_{hold}$ can be calculated by Equation 8.

$$SOC_{hold}=SOC_{limit}+\Delta SOC \qquad \text{(Equation 8)}$$

Step S10 will be described next. The guard power calculating unit 103 calculates the open-circuit voltage $OCV_{hold}$ which has to be maintained by the battery 200 in order for the battery 200 to maintain the state of charge $SOC_{hold}$. When the open-circuit voltage OCV at the state of charge SOC which is acquired with reference to the first map in which the correlation between the open-circuit voltage OCV and the state of charge SOC is defined in advance is defined as OCV=SOC_OCV_MAP(SOC), $OCV_{hold}$ (a third open-circuit voltage) can be expressed by Equation 9 by adding the estimated polarization value μ' to SOC_OCV_MAP ($SOC_{hold}$) (a second open-circuit voltage) in consideration of polarization.

$$OCV_{hold}=SOC\_OCV\_MAP(SOC_{hold})+\mu' \qquad \text{(Equation 9)}$$

Step S11 will be described next. The guard power calculating unit 103 calculates a power at the voltage $V_{low}$ when the battery 200 has an open-circuit voltage $OCV_{hold}$ as a guard power $W_{hold}$ which is a power which the battery is currently required to output in order to maintain the minimum voltage $V_{low}$ during the predetermined period T. The guard power $W_{hold}$ can be calculated by Equation 10. The guard power $W_{hold}$ has a value which is greater than the required power $W_{target}$ to correspond to a decrease in the state of charge ΔSOC and progress of polarization μ' of the battery during the predetermined period T.

$$W_{hold}=(OCV_{hold}-V_{low})/R'\times V_{low} \qquad \text{(Equation 10)}$$

Step S12 will be described next. The determination unit 104 determines whether a difference between the currently available power $W_{now}$ and the guard power $W_{hold}$ which is currently required to be output is less than a predetermined value. When the difference is less than the predetermined value, Step S13 is performed. When the difference is equal to or greater than the predetermined value, the determination unit determines that the voltage $V_{low}$ can be output during the predetermined period T and the process flow ends.

Step S13 will be described next. When the difference between $W_{out}$ and $W_{hold}$ is less than the predetermined value, it can be determined that it is difficult to output the voltage $V_{low}$ during the predetermined period T. Accordingly, the determination unit 104 instructs the external alarm device 400 to perform an alarm operation. Accordingly, the process flow ends. A user can rapidly perform an operation for stopping the vehicle or the like in response to the alarm.

The battery output monitoring device and the battery output monitoring method according to this embodiment will be described below. As described above, the battery output monitoring device 100 can specifically determine whether the battery 200 can maintain a predetermined power during a predetermined period from a current time in consideration of a decrease in the state of charge or progress of polarization of the battery 200. Accordingly, when it is difficult to maintain the power, it is possible to prompt a user to perform an escape operation such as stopping while the power can be maintained by immediately notifying the user.

The processes of the above-mentioned steps are only an example, and the specific calculation methods may be appropriately changed as long as the guard power can be calculated. The execution order of the steps may be changed as long as calculation is not hindered. The disclosure can be understood as a battery output monitoring device and can also be understood as a battery output monitoring method causing a computer including a control unit to perform the functions of the above-mentioned units or a battery output monitoring program in which the processes are written.

The disclosure can be usefully applied to monitoring a battery in a vehicle or the like.

What is claimed is:

1. A battery output monitoring device comprising:
   a battery characteristics estimating unit configured to acquire a plurality of sets of measured values of a current and a voltage of a battery and to estimate an internal resistance value and a current-less voltage of the battery based on the sets of measured values;
   a current power calculating unit configured to calculate a current power, which is a currently available output power of the battery at a predetermined minimum voltage based on the internal resistance value and the current-less voltage;
   a guard power calculating unit configured to calculate, based on at least the internal resistance value, a guard power to be greater than a required power to correspond to at least a decrease in a state of charge and progress of polarization of the battery during a predetermined period, the required power being a power required for the battery to output, and the guard power being a power required to be a currently available output power of the battery so as to output the required power at the predetermined minimum voltage during the predetermined period; and
   a determination unit configured to instruct an external alarm device to perform an alarm operation when a difference between the current power and the guard power is less than a predetermined value.

2. The battery output monitoring device according to claim 1, wherein the plurality of sets of measured values includes a set of measured values during charging of the battery and a set of measured values during discharging of the battery.

3. The battery output monitoring device according to claim 1, wherein the battery characteristics estimating unit is configured to estimate the internal resistance value by multiplying a magnitude of a rate of change of the voltage with respect to the current calculated by linear regression by a coefficient greater than 1.

4. The battery output monitoring device according to claim 1, wherein the battery characteristics estimating unit is configured to:
   acquire the sets of measured values from time to time; and
   update the estimated values of the internal resistance value and the current-less voltage by smoothing the internal resistance value and the current-less voltage which are estimated based on the newly acquired measured values and the internal resistance values and the current-less voltages which were previously estimated.

5. The battery output monitoring device according to claim 1, wherein the guard power calculating unit is configured to:
   calculate a first open-circuit voltage which is an open-circuit voltage when the required power is able to be output at the predetermined minimum voltage based on the internal resistance value;
   calculate a state of charge corresponding to the first open-circuit voltage based on a previously prepared first map, calculate an energy which the battery is to output during the predetermined period based on the required power, calculate a product of a full charging capacity and a nominal voltage of the battery as a total energy which is able to be maintained by the battery, add a ratio of energy which is to be output during the predetermined period to the total energy to the state of charge, and calculate a second open-circuit voltage which is an open-circuit voltage corresponding to the state of charge to which the ratio of energy has been added based on the first map;

calculate a third open-circuit voltage by adding a polarization value calculated using a predetermined method to the second open-circuit voltage; and calculate the power of the battery at the predetermined minimum voltage as the guard power based on the third open-circuit voltage and the internal resistance value.

6. The battery output monitoring device according to claim 5, wherein the guard power calculating unit is configured to calculate the polarization value using a previously prepared second map in which a correlation between a temperature of the battery and the polarization value corresponding to the energy which is output during the predetermined period is determined in advance using the predetermined method.

7. A battery output monitoring method of a battery output monitoring device, comprising:

acquiring a plurality of sets of measured values of a current and a voltage of a battery and estimating an internal resistance value and a current-less voltage of the battery based on the sets of measured values;

calculating a current power, which is a currently available output power of the battery at a predetermined minimum voltage based on the internal resistance value and the current-less voltage;

calculating, based on at least the internal resistance value, a guard power to be greater than a required power to correspond to at least a decrease in a state of charge and progress of polarization of the battery during a predetermined period, the required power being a power required for the battery to output, and the guard power being a power required to be a currently available output power of the battery so as to output the required power at the predetermined minimum voltage during the predetermined period; and instructing an external alarm device to perform an alarm operation when a difference between the current power and the guard power is less than a predetermined value.

* * * * *